(12) United States Patent
Regier

(10) Patent No.: US 7,903,008 B2
(45) Date of Patent: Mar. 8, 2011

(54) SOURCE-MEASURE UNIT BASED ON DIGITAL CONTROL LOOP

(75) Inventor: Christopher G. Regier, Cedar Park, TX (US)

(73) Assignee: National Instruments Corporation, Austin, TX (US)

( * ) Notice: Subject to any disclaimer, the term of this patent is extended or adjusted under 35 U.S.C. 154(b) by 9 days.

(21) Appl. No.: 12/266,089

(22) Filed: Nov. 6, 2008

(65) Prior Publication Data

US 2009/0121908 A1      May 14, 2009

Related U.S. Application Data

(60) Provisional application No. 60/986,380, filed on Nov. 8, 2007.

(51) Int. Cl.
    *H03M 1/66*      (2006.01)
(52) U.S. Cl. .......................................... 341/142; 702/60
(58) Field of Classification Search .................. 341/155, 341/144, 120, 118; 702/60
    See application file for complete search history.

(56) References Cited

U.S. PATENT DOCUMENTS

| | | | | | |
|---|---|---|---|---|---|
| 5,579,236 | A | * | 11/1996 | Tamamura et al. | 702/64 |
| 5,754,041 | A | * | 5/1998 | Kaito et al. | 324/158.1 |
| 5,970,074 | A | * | 10/1999 | Ehiro | 714/745 |
| 7,502,697 | B2 | * | 3/2009 | Holmquist et al. | 702/60 |
| 2009/0015221 | A1 | * | 1/2009 | Kodera | 323/279 |

* cited by examiner

*Primary Examiner* — Peguy JeanPierre
(74) *Attorney, Agent, or Firm* — Meyertons Hood Kivlin Kowert & Goetzel, P.C.

(57) ABSTRACT

A source-measure unit (SMU) may be implemented with a control loop configured in the digital domain. The output voltage and output current may be measured with dedicated ADCs (analog-to-digital converters). The readings obtained by the ADCs may be compared to a setpoint, which may be set in an FPGA (field programmable gate array) or DSP (digital signal processing) chip. The FPGA or DSP chip may then be used to produce an output to drive a DAC (digital-to-analog converter) until the output voltage and/or output current reach the respective desired levels. The readback values may be obtained by averaging the voltage and/or current readings provided by the ADCs. The averaging may be weighted to improve noise rejection. The digital control loop provides added flexibility to the SMU and a decrease in the accuracy requirements on the DAC, while also for solving potential range-switching issues that may arise within the SMU.

39 Claims, 11 Drawing Sheets

SOURCE-MEASURE UNIT BASED ON DIGITAL CONTROL LOOP

PRIORITY CLAIM

This application claims benefit of priority of Provisional Application Ser. No. 60/986,380 titled "Source-Measure Unit Based on Digital Control Loop" and filed on Nov. 8, 2007, whose inventor is Chris Regier, which is hereby incorporated by reference in its entirety as though fully and completely set forth herein.

BACKGROUND OF THE INVENTION

1. Field of the Invention

This invention relates generally to measurement and data acquisition systems and, more particularly, to the design of source-measure units.

2. Description of the Related Art

Scientists and engineers often use measurement systems to perform a variety of functions, including measurement of a physical phenomena a unit under test (UUT) or device under test (DUT), test and analysis of physical phenomena, process monitoring and control, control of mechanical or electrical machinery, data logging, laboratory research, and analytical chemistry, to name a few examples.

A typical measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPIB (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor, among others. Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and received digital signals to implement one or more digital I/O applications. DAQ devices may also include a Source-Measure Unit (SMU), which may apply a voltage to a DUT and measure the resulting current, or may apply a current to the DUT and measure the resulting voltage. SMUs are typically configured to operate according to what is commonly referred to as "compliance limits", to limit the output current when sourcing voltage, and limit the output voltage when sourcing current. In other words, a compliance limit on the measured signal may determine the (maximum) value of the sourced signal. For example, when applying a source voltage to a DUT and measuring current, a given current value (e.g. 1 A) specified as the compliance limit would determine the (maximum) input (source) voltage that might be provided to the DUT. In most cases compliance limits may depend and/or may be determined based on the DUTs, e.g. the maximum (absolute) value of the current that may flow into the DUT, or the maximum (absolute) value of the voltage that may be applied across the terminals of the DUT.

In the case of most SMUs, the setpoint (the desired output voltage when sourcing and regulating voltage, or the desired current value when sourcing and regulating current) and the compliance limits are typically programmable. SMUs are available to cover a variety of signal levels, from the microvolt ($\mu$V) range to the kilovolt (kV) range, and from the femtoampere (fA) range to the ampere (A) range. Some SMUs can deliver or dissipate significant power, while other SMUs may be operated at low power. The accuracy of SMUs is typically less than the accuracy of high-quality calibrators and/or digital multi meters (DMMs).

FIG. 1 shows a block diagram of a typical prior art SMU. SMUs are normally implemented with precision digital-to-analog converters (Voltage DAC 102 and Current DAC 104) to program the setpoint and compliance limits. The output voltage (across output terminals 120 and 122) or output current (flowing into output terminal 120) is typically set using analog control loops (108) by comparing the outputs to the levels set by DACs 102 and 104, respectively. Each output voltage or output current may be controlled separately, with only one of the analog control loops closed at any given time. An output stage 112 may provide current to shunt resistor 118, with current sense element 114 coupled across the terminals of resistor 118 to provide the current for measurement to the measurement multiplexer 110, from which the signal can be provided to measurement ADC 106. A voltage sense element 116 may be coupled across the output terminals 120 and 122 to provide the voltage for measurement to the measurement multiplexer 110, from which the voltage signal can be provided to measurement ADC 106. In some SMUs, separate ADCs (instead of single ADC 106) may be used to read the analog output voltage or the analog output current. The architecture exemplified in FIG. 1 is however generally limited in flexibility and is high in complexity resulting from requirements to minimize glitches during range switching. In order for the SMU to operate accurately, a high level of accuracy is required for the DACs (e.g. 102 and 104) and ADCs (e.g. 106) configured in the SMU.

FIG. 2 shows a block diagram of one prior art example of a digital power supply. In some systems, power supplies may be configured to provide some SMU functionality. For example, while most power supplies are designed to provide a constant voltage to a load, in many cases the voltage level is programmable, and in some cases the current provided to the load can be read by the power supply. Consequently, interest in what are called "digital power supplies" has increased in recent years. Digital power supplies are generally switched-mode power supplies (SMPSs) in which the analog control loop has been replaced by one or more ADCs (204) configured to measure the output voltage and possibly other parameters, along with a microcontroller (202) that controls the power switching elements to set the output voltage. Microcontroller 202 may be configured to perform the digital control and PWM (pulse width modulation) signal generation to control output transistors 212 and 214 via respective gate drive circuits 206 and 208, generating a load current in inductor 226. Resulting current flowing through resistor 216 may be provided to multiplexer 210, to be multiplexed into ADC 204 when measuring current. The input voltage may be sensed from a common node between resistors 218 and 220 coupled to input voltage $V_r$. The output voltage may be sensed from a common node between resistors 222 and 224, which may be collectively coupled across load capacitor 228. While digital control provides these devices with some degree of flexibility, they lack the full programmability and 4-quadrant operation of a true SMU. Furthermore, their dynamic range and accuracy doesn't reach the level of true SMUs.

Other corresponding issues related to the prior art will become apparent to one skilled in the art after comparing such prior art with the present invention as described herein.

SUMMARY OF THE INVENTION

In one set of embodiments, an SMU (source-measure unit) may be implemented with a control loop configured in the digital domain. The output voltage and output current may be measured with dedicated ADCs (analog-to-digital converters). When sourcing current, the current readings obtained by the ADCs may be compared to a Current Setpoint, and when sourcing voltage, the voltage readings may be compared to a Voltage Setpoint, to regulate the current and voltage outputs, respectively. The setpoints may be set in an FPGA (field programmable gate array) or DSP (digital signal processing) chip. The FPGA or DSP chip may be used accordingly to produce an output to drive a DAC (digital-to-analog converter) until the output voltage and/or output current reach the respective desired levels. The SMU may be configured to source one type of signal while measuring another type of signal. For example, the SMU may be configured to measure the voltage across the terminals of a device under test (DUT), when sourcing (and regulating) a current to the DUT, and similarly, the SMU may be configured to measure the current flowing into the DUT, when sourcing (and regulating) the voltage applied across the terminals of the DUT.

In one set of embodiment, the SMU may be configured to check the measured entity (current or voltage) against specified compliance limits, which may effectively limit the magnitude of the sourced signal. The SMU may be configured to vary (lower) the regulated current or voltage from its respective setpoint, when the measured voltage or current, respectively, exceeds the value specified by the compliance limit. For example, if the setpoint for sourcing and regulating current is 1 A, and the voltage compliance limit is 5V, if sourcing a 1 A current in the DUT results in a measured voltage that exceeds 5V, the SMU may lower the current to below 1 A until the measured voltage no longer exceeds the allowed 5V. Similarly, if the setpoint for sourcing and regulating voltage is 5V, and the current compliance limit is 1 A, if sourcing a 5V voltage across the terminals of the DUT results in a measured current that exceeds 1 A, the SMU may lower the voltage to below 5V until the measured current no longer exceeds the allowed 1 A.

The readback values (for the measured current and/or voltage) may be obtained by averaging the current and/or voltage values received from the ADCs. The averaging may be weighted to provide noise rejection advantages. Placing the control loop in the digital domain may result in added flexibility of the SMU, and a decrease in the accuracy requirements on the DAC. The digital control loop may also offer the possibility of novel approaches for solving potential range-switching issues that may arise within the SMUs.

In one set of embodiments, an SMU may comprise output terminals configured to couple the SMU to a DUT, and further configured to convey an analog output signal to the DUT to effect an output current flowing into the DUT and an output voltage in the DUT. The SMU may include a first converter configured to generate a first digital value representative of the output current, a second converter configured to generate a second digital value representative of the output voltage, and a digital control loop configured to receive the first digital value and the second digital value, and generate a digital control signal based on the first digital value and the second digital value to regulate a specified function of the output current and the output voltage to remain at a value corresponding to a setpoint. The specified function may be the output current, the output voltage, power, or resistance, to name a few. The first digital value, being representative of the output current, may correspond to a current measurement, and the second digital value being representative of the output voltage may correspond to a voltage measurement. The first digital value and second digital value may therefore effectively be used in measuring and/or controlling any function, which may be defined and/or processed in the digital control loop. For example, multiplying the first digital value and the second digital value may provide a measurement of power. Accordingly, the digital control value may be generated by the digital control loop to effect desired changes in the output current and/or the output voltage depending on what the selected function is. For example, if the selected function is power, then both the output current and output voltage may be regulated, or only one of the output current and output voltage may be regulated based on the measured output current and output voltage.

Overall, embodiments of an SMU comprising a digital control loop may offer a number of advantages. For example, DAC errors may be corrected by the digital loop, reducing the accuracy requirements on the DAC. The control algorithm may be as simple or as complex as desired, and may be configured ranging from a simple integrator to a nonlinear adaptive system, thereby offering the potential to enhance stability and speed. It may also be possible to generate functions beyond the standard current-limited voltage source and voltage-limited current source. For example, it may be possible to generate constant power or constant resistance functions. In addition, voltage range-switching may be performed transparently, and current range-switching, potentially requiring shunt switching, may be performed more accurately.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
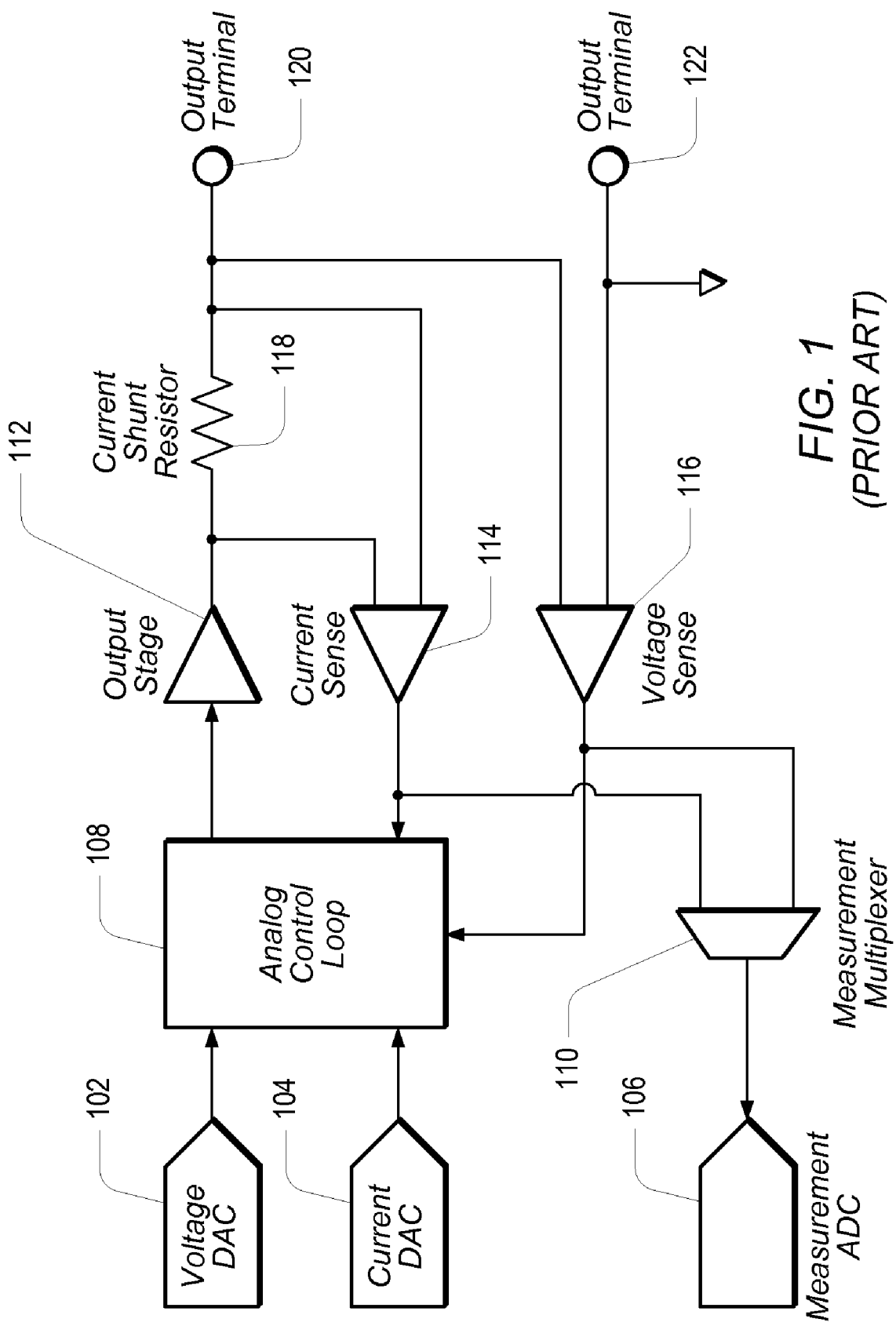
FIG. 1 is shows a block diagram of a typical prior art SMU (source-measure unit)
Figure 2:
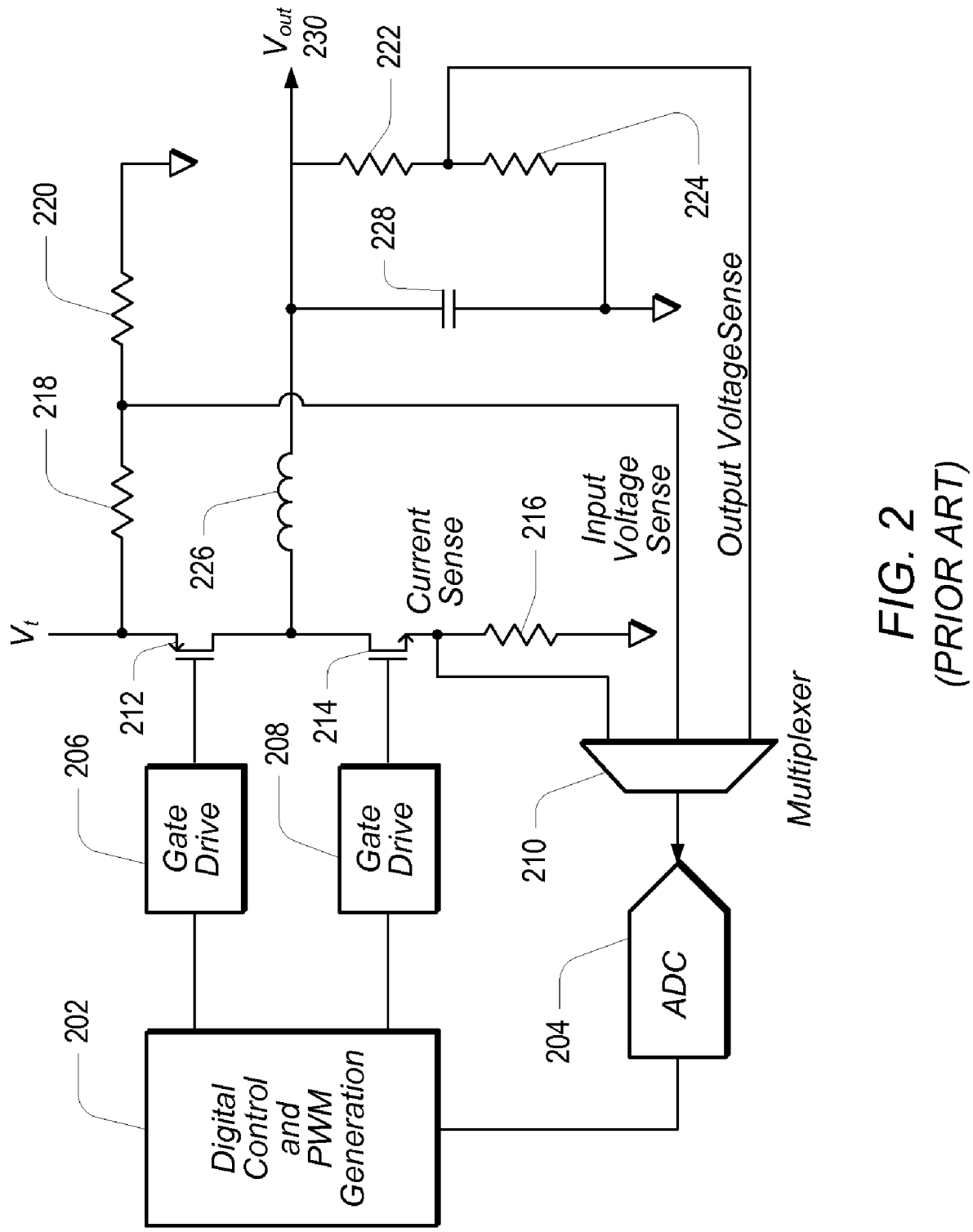
FIG. 2 shows a block diagram of one prior art example of a digital power supply.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

Figure 3:
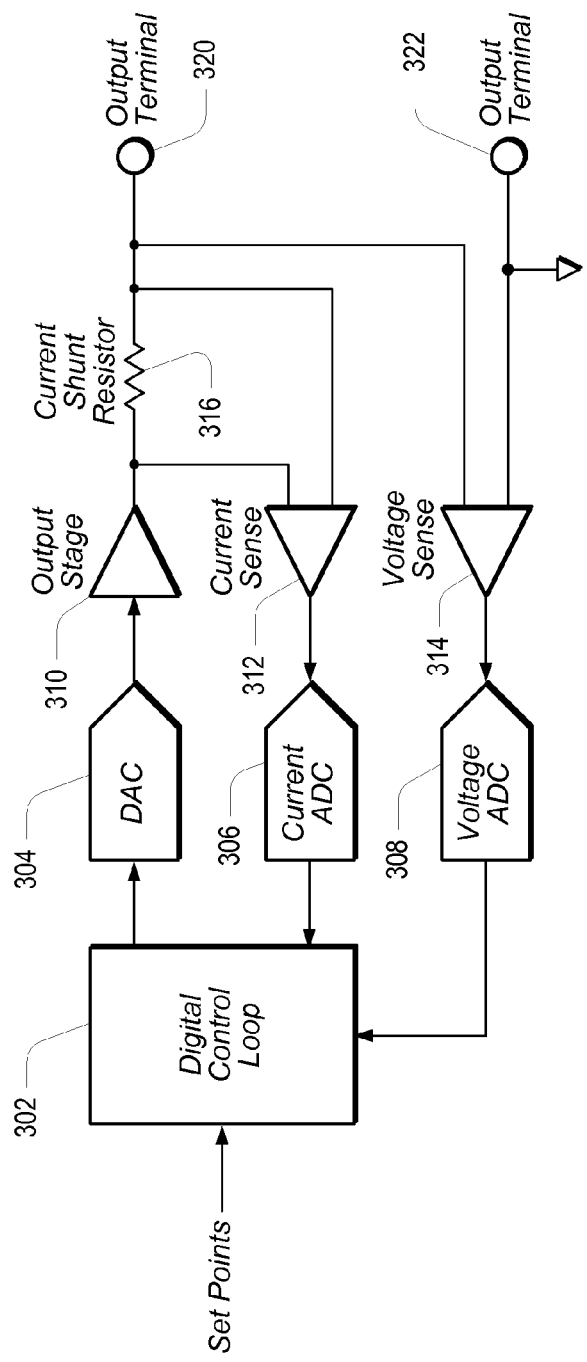
FIG. 3 shows the basic architecture of one embodiment of a novel SMU.

FIG. 3 shows the basic architecture of one embodiment of a novel SMU (source-measure unit) in which the entire control loop has been configured in the digital domain. A DUT (device under test), not shown, may be coupled between output terminals 320 and 322. Setpoints and compliance limits may be provided (programmed) to Digital Control Loop (DCL) 302, which may provide a control output through DAC (digital-to-analog converter) 304 to Output Stage 310. Feedback from Output Stage 310 may be provided to Current ADC (analog-to-digital converter) 306 and Voltage ADC 308 via respective Current Sense element 312 and Voltage Sense element 314. The current feedback may be taken from the current flowing through current shunt resistor 316, and the feedback voltage may be taken from across output terminals 320 and 322. Current ADC 306 and Voltage ADC 308 may then provide the readback current and voltage values into DCL 302.

DCL 302 may be configured to check the measured current (from Current ADC 306) resulting from a sourced voltage, against the specified current compliance limit provided (or programmed) into DCL 302. DCL 302 may similarly be configured to check the measured voltage (from Voltage ADC 308) resulting from a sourced current, against the specified voltage compliance limit provided (or programmed) into DCL 302. To regulate the output, DCL 302 may be configured to check the measured current (from Current ADC 306) resulting from a sourced current, against the specified current setpoint provided (or programmed) into DCL 302. DCL 302 may similarly be configured to check the measured voltage (from Voltage ADC 308) resulting from a sourced voltage, against the specified voltage setpoint provided (or programmed) into DCL 302.

The compliance limits may effectively limit the magnitude of the sourced signals. DCL 302 may be configured to vary (lower) the regulated current or voltage from its respective setpoint, when the measured voltage or current, respectively, exceeds the value specified by the compliance limit. For example, if the setpoint for sourcing and regulating current is 1 A, and the voltage compliance limit corresponding to a given DUT is 5V, when sourcing a 1 A current in the DUT results in a voltage measurement that exceeds 5V, DCL 302 may operate to lower the value of the sourced current below 1 A, until a sourced current value is reached for which the measured voltage no longer exceeds the allowed 5V. Similarly, if the setpoint for sourcing and regulating voltage is 5V, and the current compliance limit corresponding to a given DUT is 1 A, when sourcing a 5V voltage across the terminals of the DUT results in a current measurement that exceeds 1 A, DCL 302 may operate to lower the value of the sourced voltage below 5V, until a sourced voltage value is reached for which the measured current no longer exceeds the allowed 1 A.

Figure 4:
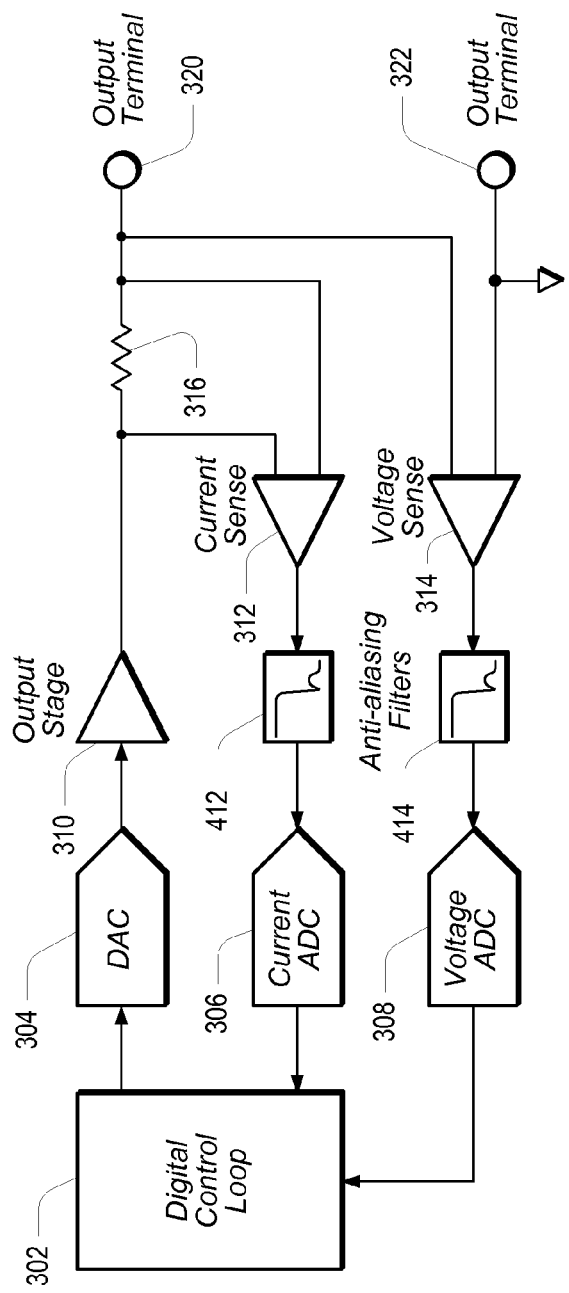
FIG. 4 shows one embodiment of a novel SMU in which anti-alias filtering has been added to the ADCs (analog-to-digital converters)

FIG. 4 shows a second embodiment of a novel SMU in which anti-alias filtering has been added to the ADCs. As shown in FIG. 4, anti-alias filter 412 may be coupled between Current Sense element 312 and Current ADC 306, and anti-alias filter 414 may be coupled between Voltage Sense element 314 and Voltage ADC 308. Anti-alias filters 412 and 414 may operate to ensure that DCL 320 does not respond to out-of-band disturbances.

Figure 5:
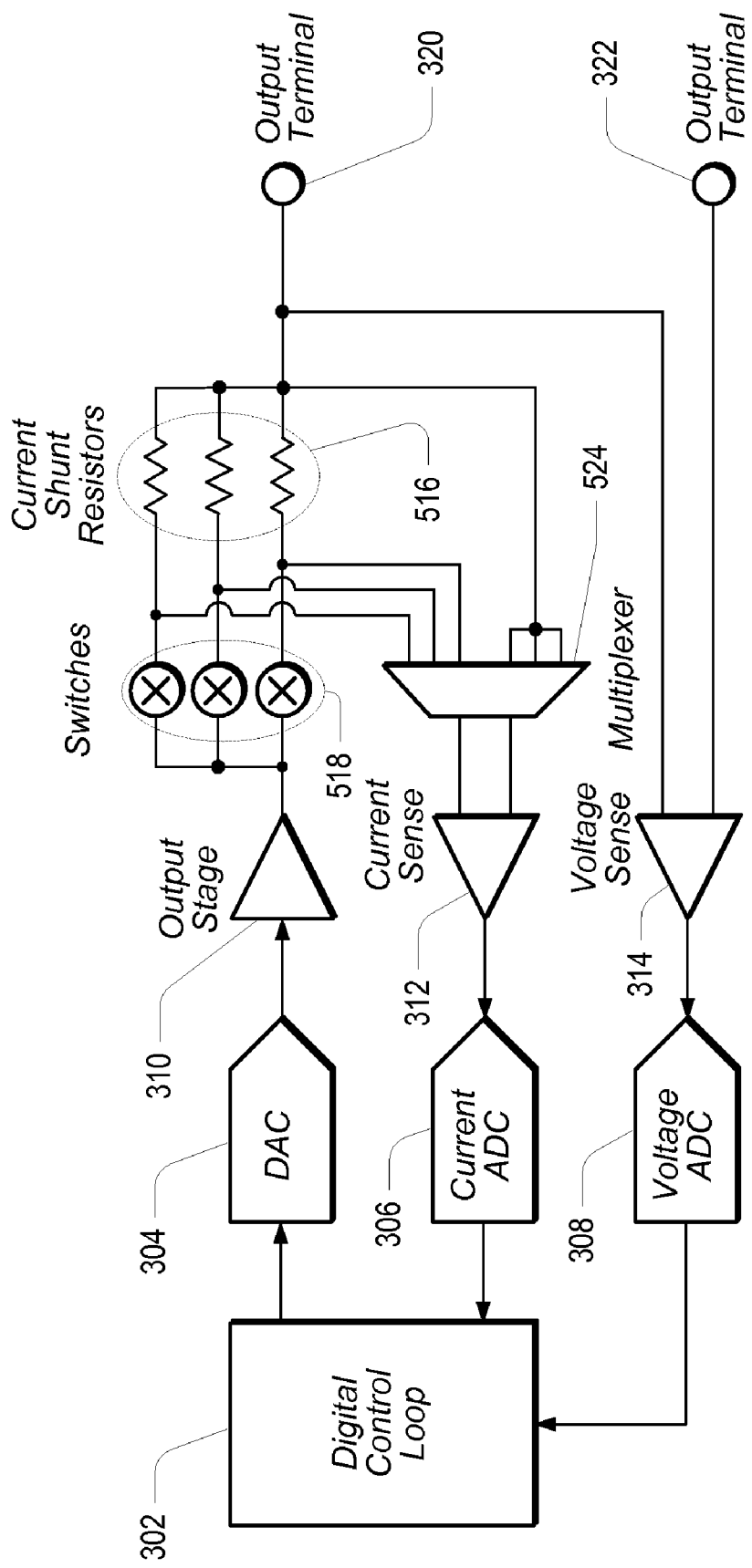
FIG. 5 shows one embodiment of a novel SMU in which shunt switching has been added in the feedback loop between the output and the current ADC.

FIG. 5 shows a third embodiment of a novel SMU in which shunt switching has been added in the feedback loop between the output (output terminal 320) and Current ADC 306. As shown in FIG. 5, different current shunt resistors 516 may be switched into the feedback loop between the output of Output Stage 310 and the inputs of Current Sense element 312, using a multiplexer 524 and a set of switches 518. While FIG. 5 shows three switches (518) and three current shunt resistors (516), alternate embodiments may be configured with a greater or lesser number of switches and/or resistors, as desired. Shunt switching may provide the SMU with the capability to cover a wider dynamic range of current. Any glitches that may result from switching between the various current shunt resistors may be minimized by adjusting the settings of DAC 304 simultaneously with the shunt-switching operation. Since the current is being measured and the values of the current shunt resistors (516) are known, it is possible to calculate the value to which DAC 304 may be set to minimize potential glitches. Any errors in the calculations may eventually be corrected by DCL 302.

Figure 6:
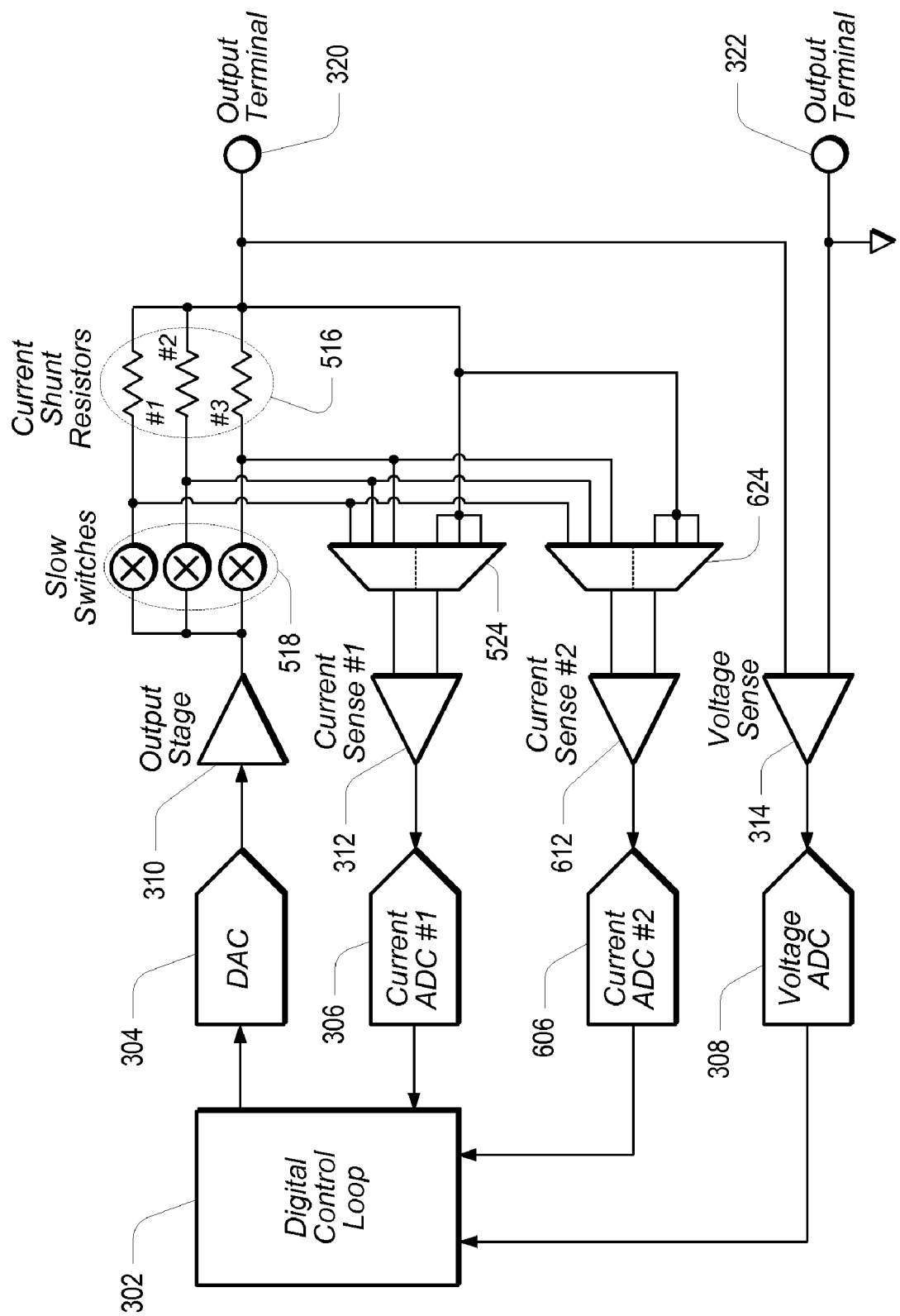
FIG. 6 shows one embodiment of a novel SMU configured to minimize glitches when switching shunt resistors.

FIG. 6 shows a fourth embodiment of a novel SMU configured to further minimize glitches that may occur when switching between current shunt resistors 516 that have been added in the feedback loop between the output and Current ADC 306. In this case, if switches 518 happen to be slow switches, they may be operated gradually to transition between the shunt resistors (516). Current shunt resistors 516 may also be switched into the feedback loop between the output of Output Stage 310 and the inputs of a second Current Sense element 612, using additional multiplexer 624, with the output of additional Current ADC 606 be coupled back to DCL 302. Additional Current ADC 606 and additional Current Sense element 612 may be provided to make it possible to simultaneously measure the current conducted by two different current shunt resistors. Thus a reading of the total current may be obtained during the shunt-switching operation, while DCL 302 remains stable and predictable. One possible way to reduce the number of switches and multiplexers in this arrangement may be to impose a specified or predetermined switching sequence on the switches. For example, Second Current ADC 606 may be configured to always measure the current through shunt #1. If, in conjunction, the switching sequence for switching from shunt #2 to shunt #3 follows the sequence shunt #2/shunt #1/shunt #3, the current may be monitored continuously while a multiplexer would only be required in front of first Current Sense element 312.

Figure 7:
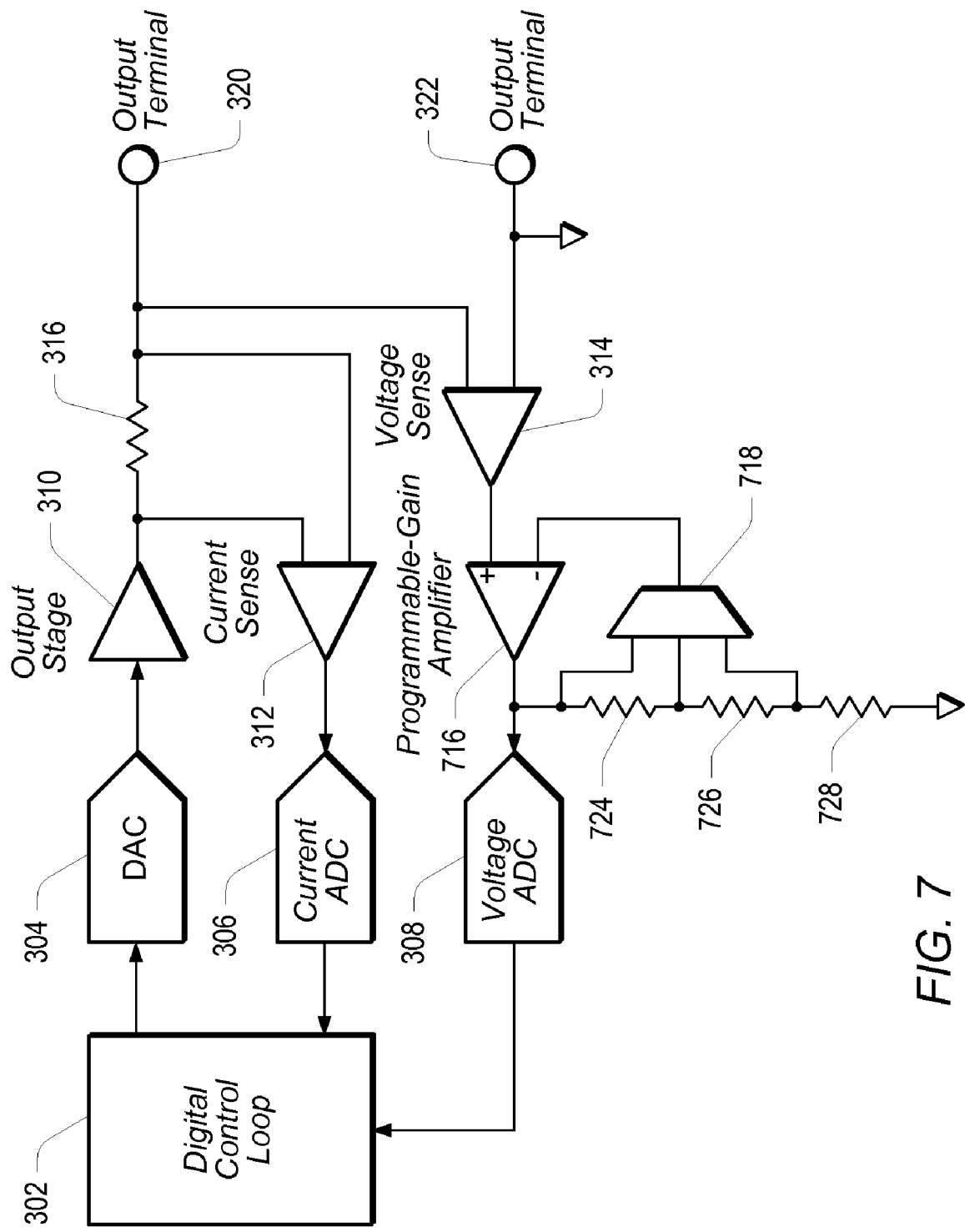
FIG. 7 shows one embodiment of a novel SMU configured with gain-ranging on the voltage ADC.

FIG. 7 shows one embodiment of a novel SMU configured with gain-ranging on voltage ADC 308. As shown in FIG. 7, a programmable-gain amplifier (PGA) 716 may be coupled between Voltage Sense element 314 and the input of Voltage ADC 308 to help maximize dynamic range of the SMU. In one embodiment, PGA 716 may be configured with two or more resistors (724-728) and a multiplexer 718 to switch between the resistors to change the gain of PGA 716. The inclusion of PGA 716 and its corresponding circuitry may not result in additional potential glitches, since the control system (in the form of DCL 302) offers the capability of immediately compensating for changes in the gain of PGA 716.

Figure 8:
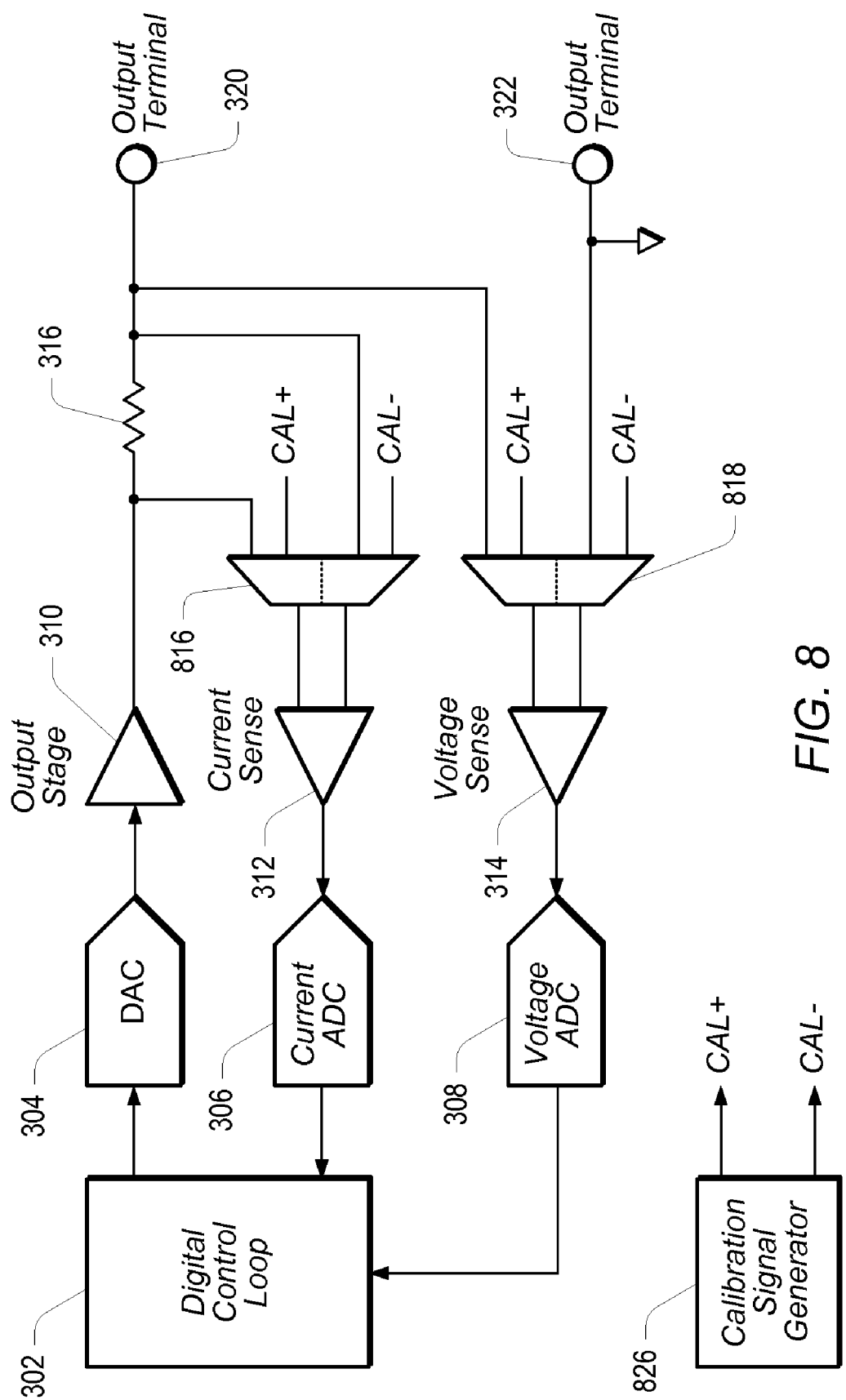
FIG. 8 shows one embodiment of a novel SMU configured with multiplexers at the ADC inputs.

FIG. 8 shows one embodiment of a novel SMU configured with multiplexers 816 and 818 coupled to the inputs of Current ADC 306 and Voltage ADC 308, respectively, to allow for self-calibration. As shown in the embodiment of FIG. 8, first multiplexer 816 may be configured to selectively provide to Current Sense element 312 the calibration signals CAL+/CAL−, or the voltage values taken from the terminals of resistor 316, representing the current flowing in resistor 316. Similarly, second multiplexer 818 may be configured to selectively provide to Voltage Sense element 314 the calibration signals CAL+/CAL−, or the voltage values taken from output terminals 320 and 322, representing the feedback/output voltage. A Calibration Signal Generator 826, which may be comprised in the SMU or may be configured separate from the SMU, may be used to generate calibration signals CAL+ and CAL−, which may are provided to multiplexers 816 and 818 to select in lieu of the measured entities during calibration.

Figure 9:
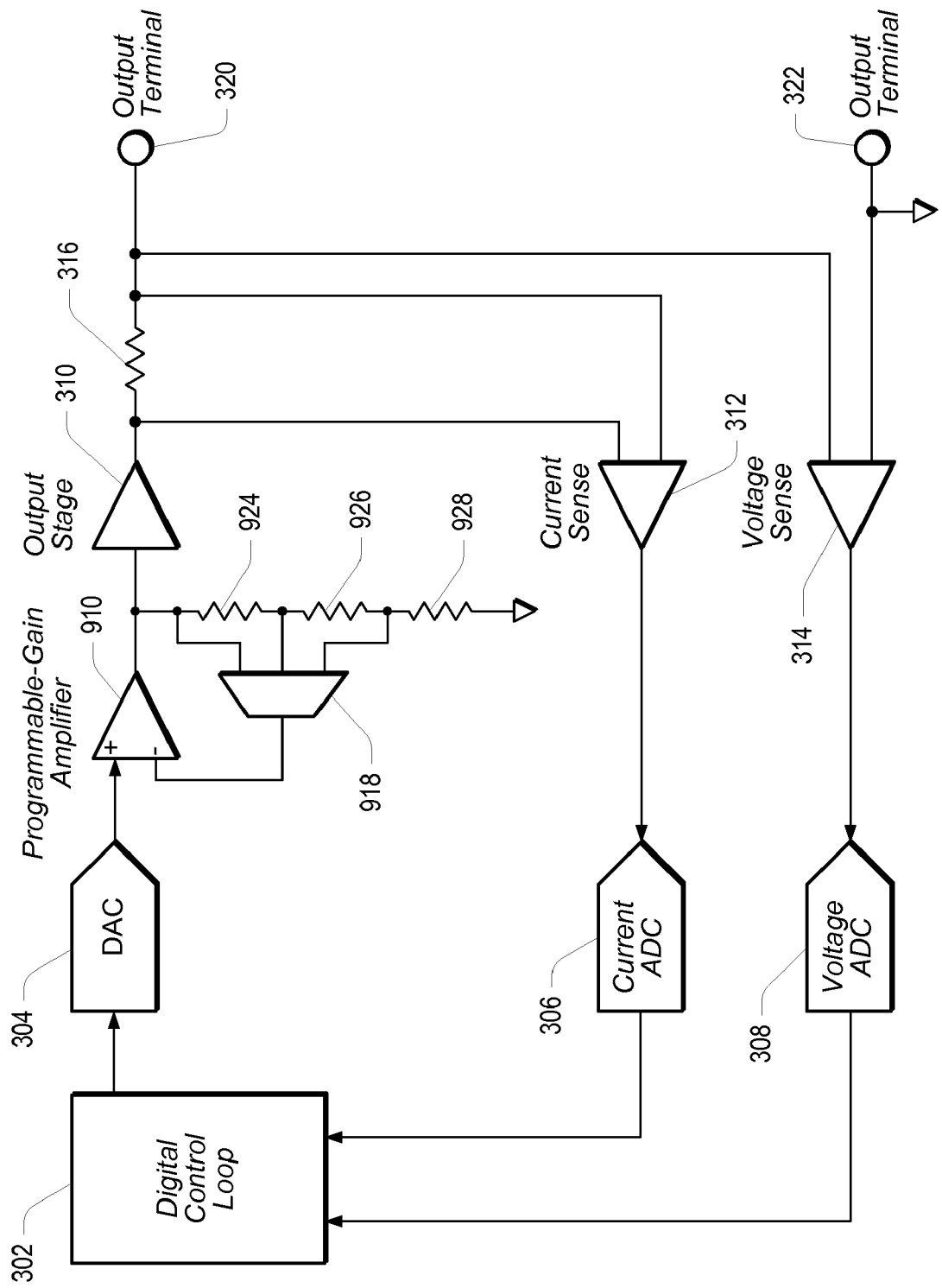
FIG. 9 shows one embodiment of a novel SMU configured with gain-ranging on the DAC (digital-to-analog converter)

FIG. 9 shows one embodiment of a novel SMU that is similar in concept to the embodiment shown in FIG. 7. In the embodiment shown in FIG. 9, the SMU is configured with gain-ranging on DAC 304 to increase the dynamic range of the SMU (as opposed to providing gain ranging on Voltage ADC 308, as shown in FIG. 7). As shown in FIG. 9, a programmable-gain amplifier (PGA) 910 may be coupled between the output of DAC 304 and the input of Output Stage 310 to help maximize dynamic range of the SMU. As in the embodiment shown in FIG. 7, the PGA may again include two or more resistors (924-928) and a multiplexer 918 to switch between the resistors to change the gain of the amplifier (PGA 910). Any glitches that may occur when switching between the resistors may be minimized by adjusting the setting for DAC 304 simultaneously with the gain-switching operation.

Figure 10:
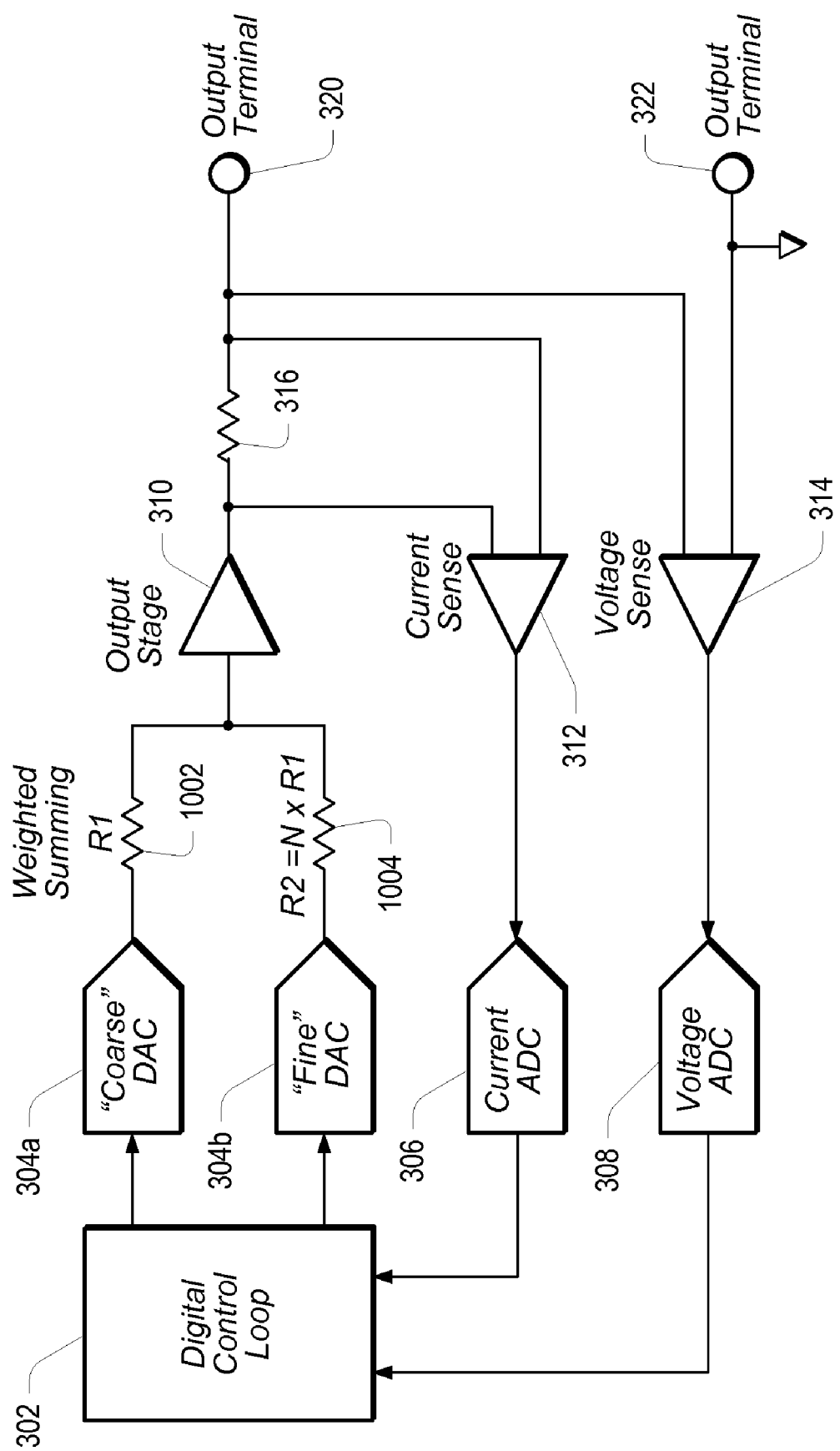
FIG. 10 shows one embodiment of a novel SMU configured with multiple DACs.

FIG. 10 shows one embodiment of a novel SMU, in which increased dynamic range may be achieved by configuring the SMU with multiple DACs (304a and 304b) in lieu of the single DAC 304 shown in other embodiments. As previously explained, various embodiments do not impose strict accuracy requirements on DAC 304 due to the control system (in the form of DCL 302) having the capability of compensating for any inaccuracies that may result from operation of DAC 304. Therefore, multiple DACs 304a and 304b may be configured to provide a coarse/fine arrangement, respectively. As shown in FIG. 10, the output of a first DAC 304a and the output of a second DAC 304b may be coupled to the input of Output Stage 310, with DAC 304b configured to have a "finer" (i.e. more subtle) effect on the output of Output stage 310 than DAC 304a. This may be accomplished by performing weighted summing via respective resistors R1 1002 and R2 1004, where R2 may be a multiple (N) of R2, to provide the differing resolutions. For example, resistor 1004 may be configured to have a value of 100 times that of resistor 1002. In one set of embodiments, DACs 304a and 304b may be may be identical or of similar type, and may be configured with a bit-overlap to ensure there are no missing codes. In addition, the control logic in DCL 302 may be configured to provide hysteresis functionality to avoid unnecessary switching of coarse DAC 304a.

Figure 11:
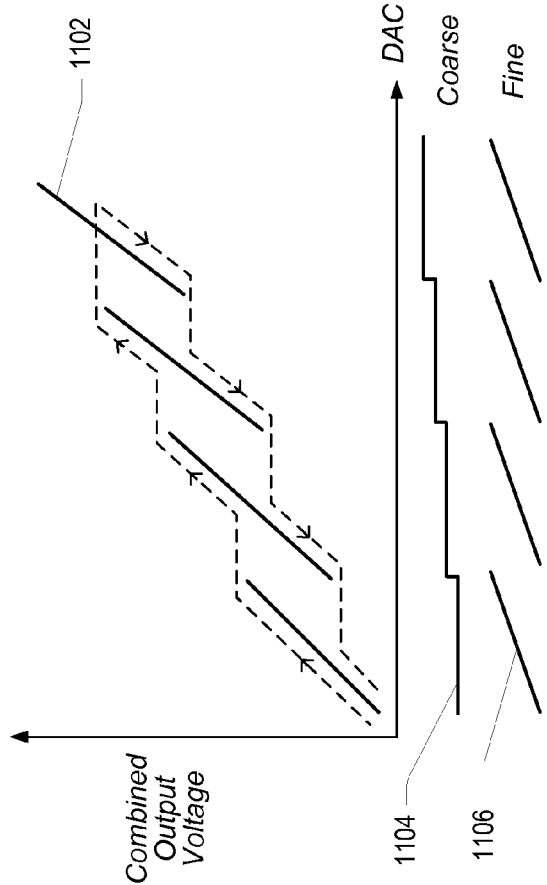
FIG. 11 shows one possible transfer function with hysteresis for the compound DAC.

FIG. 11 shows a possible transfer function 1102 with hysteresis for a compound DAC (e.g. comprising first DAC 304a configured to provide a coarse resolution and second DAC 304b configured to provide a fine resolution) of the embodiment of FIG. 10. The dashed lines of the transfer function curve represent the hysteresis. The input codes for DAC 304a are indicated by the step function 1104, while the input codes for DAC 304b are indicated by the linear functions 1106. As shown, a coarse setting may provide a base output, which may then be fine tuned by applying a higher resolution code to fine-tune the output residing between respective outputs corresponding to consecutive coarse input codes.

Figure 12:
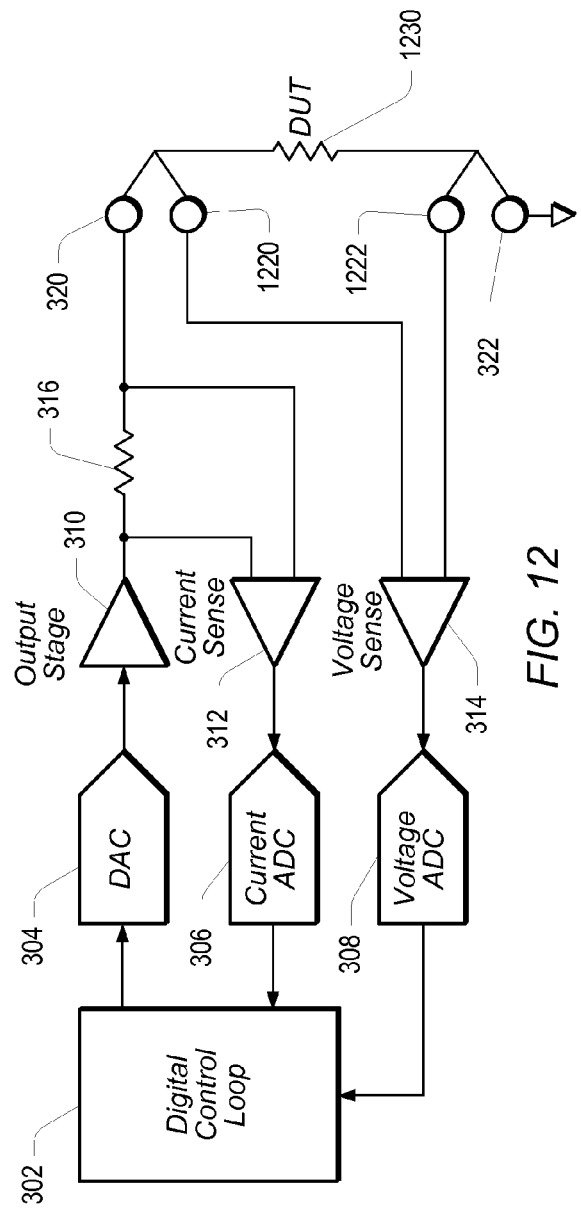
FIG. 12 shows one embodiment of a novel SMU configured to operate with a 4-wire connection to the DUT (device under test)

In addition to the 2-wire DUT connection method shown in the previous figures, various embodiments of the novel SMU may be configured to operate with 4-wire connections in addition to 2-wire connections, as shown in FIG. 12. In these embodiments, Current Sense element 312 may be coupled to terminal 320, and signal ground may be coupled to terminal 322, as shown, where terminals 320 and 322 may be coupled to a pair of nodes within the DUT via connections (e.g. leads and/or wires) that carry the DUT current. In contrast, one input of Voltage Sense element 314 may be coupled to terminal 1220, while the other input of Voltage Sense element 314 may be coupled to terminal 1222, where terminals 1220 and 1222 may be coupled to the pair of nodes within the DUT through connections (e.g. wires and/or leads) that carry negligible or no current. In this case, negligible (or no) current may refer to any current level that will not affect the desired accuracy of the voltage measurement obtained through Voltage Sense element 314 and ADC 308, allowing terminals 1220 and 1222 to be configured for sensing voltage at the DUT without concern for lead/wire resistance. In other words, a 4-wire configuration, such as the one shown in FIG. 12, may allow sensing the voltage at the DUT through wires that carry negligible current, eliminating any impact that lead resistance may have on measurements performed using only a 2-wire connection. Thus, terminals 1220 and 1222 may be configured along with voltage sense element 314 to sense the voltage remotely at the DUT rather than locally at the output terminals (which may be terminals 320 and 322 in the embodiment shown in FIG. 12), in order to obtain a more accurate voltage measurement of the DUT, or to more accurately regulate the voltage in the DUT.

The Current ADCs (e.g. 306, and/or 606) and Voltage ADCs (e.g. 308) may be implemented as noise-shaping ADCs. In embodiments featuring noise-shaping ADCs, the noise shaping of the ADCs may operate to provide noise shaping to the DAC (e.g. DAC 304), which may be beneficial for reducing low-frequency noise. For example, the ADCs may be implemented using continuous-time sigma-delta modulators, which may obviate the need for anti-alias filters (such as the filters shown in FIG. 4), resulting in reduced complexity and faster loop response (better stability). In case noise-shaping is not employed, it may still be preferable to provide sufficient dither for the ADCs and the DAC to de-correlate quantization noise from the signal.

In one set of embodiments, DCL 302 may be implemented with an ASIC, a DSP, an FPGA, or any other suitable digital circuitry configured to perform the designated functions of DCL 302. An FPGA may be preferable for implementations utilizing National Instruments' LabVIEW graphical programming interface to write and simulate the control code. When using an FPGA with LabVIEW, the control code may be deployed and tested through LV-FPGA (LabVIEW FPGA). The control system itself may be designed to emulate a traditional SMU, while allowing users to implement more advanced features by writing their own control algorithm (for example in LV-FPGA when using LabVIEW and an FPGA). Some embodiments may also implement more advanced features such as constant power delivery or sinking, or constant resistance generation. For safety considerations, especially in user-configured situations, the output of DAC 304 may be limited to a safe level, regardless of feedback.

In another set of embodiments, the control algorithm (which may be implemented in DCL 302) may be a PID (proportional integral derivative) controller or a variant thereof. In yet other embodiments the control algorithm may be based on fuzzy logic, or it may be nonlinear. The control algorithm may additionally be devised as an adaptive algorithm. In certain embodiments it may be configured to include programmable speed/stability tradeoff. For example, as a simple substitute for an adaptive control algorithm, the speed/stability tradeoff may be exposed to the users, who may be able to choose stable/normal/fast with any degree of resolution to match their expected test setup. The control system may also be designed to compensate for the load presented by an attenuator that may be required to measure high voltages.

The Digital Control Loop (e.g. DCL 302) may provide the added flexibility of being able to operate the SMU for different compliance limits, (and being able to program multiple setpoints), without additional components, which could not be achieved in prior art systems configured with analog control loops. In addition, the loop bandwidth may easily be adjusted by changing the controller coefficients, and control loop adjustments may be made through measurable and controllable settling times of the signal. The DCL may also be reconfigurable to the desired mode, controlling/generating current, voltage, power, resistance, or voltage with series impedance, which may be valuable in battery simulation applications.

Figure 13:
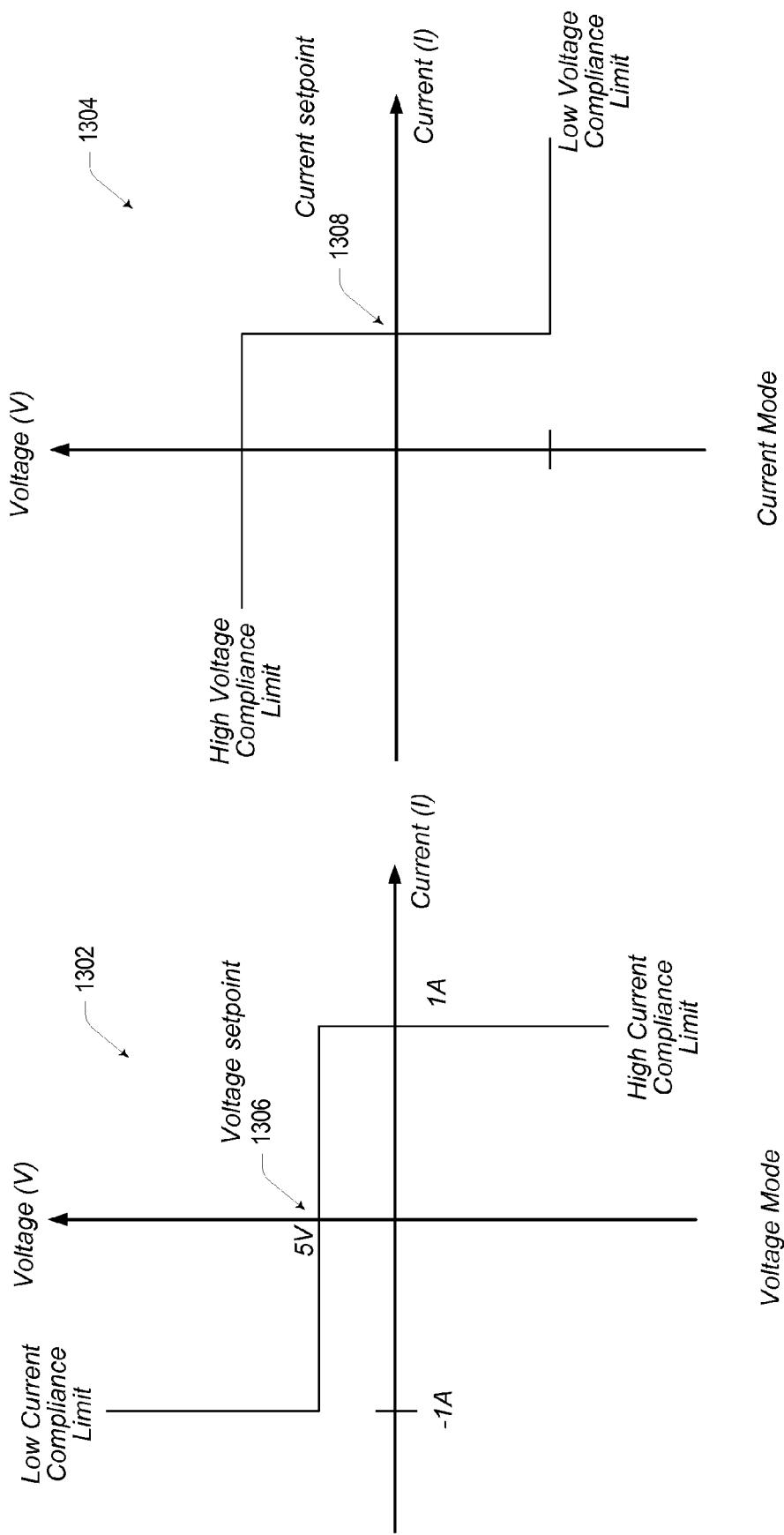
FIG. 13 shows diagrams illustrating Voltage Mode and Current Mode compliance limits and respective setpoints, according to one embodiment.

Prior art systems configured with analog control loops required a different control loop for each control mode. A scanlist comprising a sequence of setpoints may be used to operate the SMU without requiring additional components, while also retaining the ability to operate within given compliance limits. FIG. 13 shows example diagrams illustrating the Voltage setpoint 1306 when operating the SMU in Voltage Mode (which may refer to sourcing and regulating voltage to measure current), and the Current setpoint when operating in Current Mode (which may refer to sourcing and regulating current to measure voltage). Example values are shown for the Voltage mode operation, with the low current compliance limit being −1 A, the high current compliance limit being 1 A, with a Voltage setpoint of 5V.

It should also be noted that when trying to regulate power, for example, two ADCs may be required for obtaining the requisite measurements for the power regulation to be performed. One ADC may be required to measure current (e.g. ADC 306) and another ADC may be required to measure voltage (e.g. ADC 308), with the multiplication (to obtain the power value that may be compared to a setpoint) performed digitally, in DCL 302, for example. Thus, certain embodiments, where the sourced and measured entity is the same (e.g. sourcing current and measuring current), may be configured with a single ADC. In one set of embodiments, when only always one entity (e.g. Current or Voltage) is to be measured, one of the ADCs may simply be removed. In another set of embodiments, the output from the Current Sense element and the output of the Voltage Sense element may be input to a multiplexer (not shown in any of the figures), which may be used to select whether sensed voltage or sensed current is to be converted to the digital value provided to the Digital Control Loop. These embodiments may be useful, for example, in certain applications where compliance limits were unnecessary, and/or the primary functionality was regulation of the output.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

I claim:

1. A source-measure unit (SMU) comprising:
   output terminals configured to couple the SMU to a device under test (DUT), and further configured to convey an analog output signal to the DUT to effect:
   an output current flowing into the DUT; and
   an output voltage in the DUT;
   a first converter configured to generate a first digital value representative of the output current;
   a second converter configured to generate a second digital value representative of the output voltage;
   a digital control loop configured to receive the first digital value and the second digital value, and generate a digital control signal based on the first digital value and the second digital value to regulate a specified function of the output current and the output voltage to remain at a value corresponding to a setpoint; and
   a third converter comprising:
      a digital-to-analog converter (DAC) configured to generate an analog control signal based on the digital control signal;
      a gain circuit configured to adjust a level of the analog control signal to generate an adjusted analog control signal, to increase dynamic range of the SMU; and an output stage configured to generate the analog output signal based on the adjusted analog control signal.

2. The SMU of claim 1, wherein the specified function is one or more of:
the output current;
the output voltage;
power; and
resistance.

3. The SMU of claim 1, wherein the gain circuit comprises:
a programmable gain amplifier (PGA) having an output configured to provide the adjusted analog control signal to the output stage, having a first input configured to receive the analog control signal, and having a second input; and
a resistive circuit having an adjustable resistance and configured in a feedback loop between the second input and the output of the PGA, to adjust a gain of the PGA.

4. The SMU of claim 1, further comprising a resistive element configured to provide an impedance between a first input terminal and a second input terminal of the first converter, and wherein current conducted by the resistive element is the output current.

5. A source-measure unit (SMU) comprising:
output terminals configured to couple the SMU to a device under test (DUT), and further configured to convey an analog output signal to the DUT to effect:
an output current flowing into the DUT; and
an output voltage in the DUT;
a first converter configured to generate a first digital value representative of the output current;
a second converter configured to generate a second digital value representative of the output voltage; and
a digital control loop configured to receive the first digital value and the second digital value, and generate a digital control signal based on the first digital value and the second digital value to regulate a specified function of the output current and the output voltage to remain at a value corresponding to a setpoint; and
a shunt switching circuit configured to provide an impedance between a first input terminal and a second input terminal of the first converter, wherein current conducted by the impedance is the output current, and wherein the impedance is adjustable to vary a dynamic range for the output current.

6. The SMU of claim 5, further comprising:
a third converter configured to generate the analog output signal based on the digital control signal;
wherein the shunt switching circuit comprises a plurality of resistive elements, wherein the impedance is adjustable by switching between the plurality of resistive elements;
wherein the third converter is configured to have its settings adjusted simultaneously with the switching between the plurality of resistive elements to minimize glitches resulting from the switching between the plurality of resistive elements.

7. A source-measure unit (SMU) comprising:
output terminals configured to couple the SMU to a device under test (DUT), and further configured to convey an analog output signal to the DUT to effect:
an output current flowing into the DUT; and
an output voltage in the DUT;
a first converter comprising:
a current sense element configured to generate a first analog signal representative of the output current; and
a first analog to digital converter (ADC) configured to generate a first digital value based on the first analog signal;

a second converter comprising:
a voltage sense element configured to generate a second analog signal representative of the output voltage; and
a second ADC configured to generate a second digital value based on the second analog signal;
a digital control loop configured to receive the first digital value and the second digital value, and generate a digital control signal based on the first digital value and the second digital value to regulate a specified function of the output current and the output voltage to remain at a value corresponding to a setpoint; and one or more of:
a first anti-aliasing filter coupled between the current sense element and the first ADC to ensure that the digital control loop does not respond to out-of-band disturbances; and
a second anti-aliasing filter coupled between the voltage sense element and the second ADC to ensure that the digital control loop does not respond to out-of-band disturbances.

8. A source-measure unit (SMU) comprising:
output terminals configured to couple the SMU to a device under test (DUT), and further configured to convey an analog output signal to the DUT to effect:
an output current flowing into the DUT; and
an output voltage in the DUT;
a first converter configured to generate a first digital value representative of the output current;
a second converter comprising:
a voltage sense element configured to generate a second analog signal representative of the output voltage;
a gain circuit configured to adjust a level of the second analog signal to generate an adjusted second analog signal, to increase dynamic range of the SMU; and
an ADC configured to generate a second digital value based on the adjusted second analog signal; and
a digital control loop configured to receive the first digital value and the second digital value, and generate a digital control signal based on the first digital value and the second digital value to regulate a specified function of the output current and the output voltage to remain at a value corresponding to a setpoint.

9. The SMU of claim 8, wherein the gain circuit comprises:
a programmable gain amplifier (PGA) having an output configured to provide the adjusted second analog signal to the ADC, having a first input configured to receive the second analog signal, and having a second input; and
a resistive circuit having an adjustable resistance and configured in a feedback loop between the second input and the output of the PGA, to adjust a gain of the PGA.

10. A source-measure unit (SMU) comprising:
output terminals configured to couple the SMU to a device under test (DUT), and further configured to convey an analog output signal to the DUT to effect:
an output current flowing into the DUT; and
an output voltage in the DUT;
a first converter configured to generate a first digital value representative of the output current;
a second converter configured to generate a second digital value representative of the output voltage;
a digital control loop configured to receive the first digital value and the second digital value, and generate a digital control signal based on the first digital value and the second digital value to regulate a specified function of the output current and the output voltage to remain at a value corresponding to a setpoint;
a first switching module coupled to an input of the first converter; and a second switching module coupled to an input of the second converter;

wherein the first switching module and the second switching module are configured to switchably provide a calibration signal to the first converter and to the second converter;

wherein the first converter and the second converter are configured to respectively generate digital values representative of the calibration signal when the first switching module and the second switching module are providing the calibration signal to the first converter and to the second converter; and wherein the digital control loop is configured to receive the digital values representative of the calibration signal, to calibrate the SMU.

11. The SMU of claim 10, further comprising a calibration signal generator configured to generate the calibration signal.

12. The SMU of claim 10, wherein the first switching module and the second switching module are multiplexers.

13. A source-measure unit (SMU) comprising:
output terminals configured to couple the SMU to a device under test (DUT), and further configured to convey an analog output signal to the DUT to effect:
an output current flowing into the DUT; and
an output voltage in the DUT;
a first converter configured to generate a first digital value representative of the output current;
a second converter configured to generate a second digital value representative of the output voltage; and
a digital control loop configured to receive the first digital value and the second digital value, and further configured to generate a first digital control signal and a second digital control signal based on the first digital value and the second digital value to regulate a specified function of the output current and the output voltage to remain at a value corresponding to a setpoint.

14. The SMU of claim 13, further comprising:
a first digital to analog converter (DAC) configured to receive the first digital control signal and generate a corresponding first analog signal;
a second DAC configured to receive the second digital control signal and generate a corresponding second analog signal; and
an output stage configured to generate the analog output signal based on the first analog signal and the second analog signal.

15. The SMU of claim 14;
wherein the output stage is configured to receive the first analog signal and the second analog signal, and generate the analog output signal based on a weighted sum of the first analog signal and the second analog signal to have the second DAC effect a subtler change in the analog output signal than the first DAC.

16. A source-measure unit (SMU) comprising:
output terminals configured to couple the SMU to a device under test (DUT), and further configured to convey an analog output signal to the DUT to effect:
an output current flowing into the DUT; and
an output voltage in the DUT;
a first converter configured to generate a first digital value representative of the output current;
a second converter configured to generate a second digital value representative of the output voltage; and
a digital control loop configured to:
receive the first digital value and the second digital value;
generate a digital control signal based on the first digital value and the second digital value to regulate a specified function of the output current and the output voltage to remain at a value corresponding to a setpoint;
check the first digital value against a specified compliance limit while regulating the output voltage to remain at a respective value corresponding to a specified voltage setpoint; and
lower the output voltage if the first digital value is indicative of the specified compliance limit having been exceeded, until the first digital value is no longer indicative of the specified compliance limit having been exceeded.

17. A source-measure unit (SMU) comprising:
output terminals configured to couple the SMU to a device under test (DUT), and further configured to convey an analog output signal to the DUT to effect:
an output current flowing into the DUT; and
an output voltage in the DUT;
a first converter configured to generate a first digital value representative of the output current;
a second converter configured to generate a second digital value representative of the output voltage; and
a digital control loop configured to:
receive the first digital value and the second digital value;
generate a digital control signal based on the first digital value and the second digital value to regulate a specified function of the output current and the output voltage to remain at a value corresponding to a setpoint;
check the second digital value against a specified compliance limit while regulating the output current to remain at a respective value corresponding to a specified current setpoint; and
lower the output current if the second digital value is indicative of the specified compliance limit having been exceeded, until the second digital value is no longer indicative of the specified compliance limit having been exceeded.

18. A source-measure unit (SMU) comprising:
output terminals configured to couple the SMU to a device under test (DUT), and further configured to convey an analog output signal to the DUT to effect:
an output current flowing into the DUT; and
an output voltage in the DUT;
a first converter configured to generate a first digital value representative of the output current;
a second converter configured to generate a second digital value representative of the output voltage; and
a digital control loop configured to receive the first digital value and the second digital value, and generate a digital control signal based on the first digital value and the second digital value to regulate a specified function of the output current and the output voltage to remain at a value corresponding to a setpoint;
wherein the output terminals comprise one of:
a pair of terminals configured to couple to a respective pair of nodes of the DUT to convey the analog output signal to the DUT; or
a first pair of terminals and a second pair of terminals, wherein the first pair of terminals are configured to couple to the respective pair of nodes of the DUT to convey the analog output signal to the DUT, and the second pair of terminals are coupled to respective inputs of the second converter circuit and configured to couple to the respective pair of nodes of the DUT through connections that carry negligible current.

19. A data acquisition system comprising the SMU of claim 1.

20. A source-measure unit (SMU) comprising:
output terminals configured to couple the SMU to a DUT, and further configured to convey an analog output signal to the DUT to effect:
an output current flowing into the DUT; and
an output voltage in the DUT;
a first converter configured to generate a first digital value representative of a first portion of the output current;
a second converter configured to generate a second digital value representative of a remaining portion of the output current;
a third converter configured to generate a third digital value representative of the output voltage;
a digital control loop configured to receive the first digital value, the second digital value, and the third digital value, and further configured to generate a digital control signal based on the first digital value, the second digital value, and the third digital value to regulate a specified function of the output current and the output voltage to remain at a value corresponding to a setpoint; and
a shunt switching circuit comprising a plurality of resistive elements and configured to provide a first impedance between a first input terminal and a second input terminal of the first converter, and to provide a second impedance between a first input terminal and a second input terminal of the second converter, wherein the first impedance and the second impedance are adjustable by switching between the plurality of resistive elements to vary a dynamic range for the output current;
wherein current conducted by the first impedance is the first portion of the output current, and current conducted by the second impedance is the remaining portion of the output current; and
wherein the digital control loop is configured to remain stable during the switching between the plurality of resistive elements, wherein a sum of the first digital value and the second digital value is representative of the output current.

21. The SMU of claim 20, further comprising a fourth converter configured to generate the analog output signal based on the digital control signal.

22. The SMU of claim 20, wherein the shunt switching circuit is configured to provide a constant impedance commensurate with one of the plurality of resistive elements as the second impedance;
wherein the shunt switching circuit is further configured to switch between the plurality of resistive elements in a predetermined sequence when adjusting the first impedance, to allow for continuous monitoring of the output current by the digital control loop.

23. An SMU (source-measure unit) comprising:
output terminals configured to couple the SMU to a DUT (device under test), and to convey an analog output signal to the DUT to obtain an analog device signal in the DUT;
a first ADC (analog-to-digital converter) configured to generate a first digital device signal representative of a DUT current corresponding to the analog device signal;
a second ADC configured to generate a second digital device signal representative of a DUT voltage corresponding to the analog device signal;
a digital control element configured to receive the first digital device signal and the second digital device signal, and generate a digital control signal to:
regulate the DUT current by adjusting the digital control signal until the analog device signal reaches a value corresponding to a desired DUT current, and by further adjusting the digital control signal to lower the analog device signal below the value corresponding to the desired DUT current if the second digital device signal indicates that the DUT voltage has exceeded a specified limit; and/or
regulate the DUT voltage by adjusting the digital control signal until the analog device signal reaches a value corresponding to the desired DUT voltage, and by further adjusting the digital control signal to lower the analog device signal below the value corresponding to the desired DUT voltage, if the first digital device signal indicates that the DUT current has exceeded a specified limit;
a DAC (digital-to-analog converter) having an input coupled to the digital control element to receive the digital control signal, and having an output, wherein the DAC is operable to convert the digital control signal into an analog control signal; and
an output stage operable to generate the analog output signal based on the analog control signal.

24. The SMU of claim 23, further comprising one or more of:
a first anti-aliasing filter coupled to an input of the first ADC and configured to receive and filter a first analog signal representative of the DUT current, wherein the first ADC is operable to receive and convert the filtered first analog signal to the first digital device signal; or
a second anti-aliasing filter coupled to an input of the second ADC and configured to receive and filter a second analog signal representative of the DUT voltage, wherein the second ADC is operable to receive and convert the filtered second analog signal to the second digital device signal.

25. The SMU of claim 23, further comprising a shunt switching circuit coupled between the output of the DAC and an input of the first ADC, to control a dynamic range of the analog device signal.

26. The SMU of claim 25, further comprising an additional ADC having an input coupled to the shunt switching circuit and an output coupled to the digital control element, to minimize glitches during operation of the shunt switching circuit.

27. The SMU of claim 26, wherein the additional ADC in combination with the first ADC and the shunt switching circuit is operable to convey a total of the first digital device signal to the digital control element even during switching operation of the shunt switching circuit.

28. The SMU of claim 23, further comprising a programmable-gain circuit coupled to an input of the second ADC and configured to:
receive an analog signal representative of the DUT voltage;
adjust an amplitude of the analog signal;
provide the analog signal having the adjusted amplitude to the second ADC.

29. The SMU of claim 23, further comprising:
a calibration circuit operable to generate a pair of calibration signals;
a multiplexer configured to selectively couple the pair of calibration signals to an input of the first ADC and to an input of the second ADC to provide the SMU with self-calibrating capability.

30. The SMU of claim 23, further comprising a programmable-gain circuit coupled to the output of the DAC and configured to:
- receive the analog output signal;
- adjust an amplitude of the analog output signal; and
- provide the analog output signal with the adjusted amplitude to the output terminals.

31. The SMU of claim 23, further comprising:
- an additional DAC having an output, and having an input coupled to the digital control element to receive an additional digital control signal, wherein the DAC is operable to convert the additional digital control signal into an additional analog control signal; and
- a summing circuit operable to generate a compound analog control signal from the analog control signal and the additional analog control signal, wherein the summing circuit is configured to have the additional DAC effect a subtler change in the compound analog control signal than the DAC; and
- an output stage operable to generate the analog output signal based on the compound analog control signal;
- wherein the digital control element is operable to change a value of the additional digital control signal until the analog device signal reaches a desired level.

32. The SMU of claim 23, wherein the output terminals comprise one of:
- a pair of terminals configured to couple to a respective pair of nodes of the DUT to convey the analog output signal to the DUT; or
- a first pair of terminals and a second pair of terminals, wherein the first pair of terminals are configured to couple to a respective pair of nodes of the DUT to convey the analog output signal to the DUT, and the second pair of terminals are coupled to an input of the second ADC and configured to couple to the pair of nodes of the DUT through connections carrying negligible current.

33. The SMU of claim 23, wherein the digital control element is configured to regulate the DUT current and the DUT voltage in concert to regulate one or more of:
- power;
- resistance; or
- impedance.

34. A method for sourcing and measuring signals in a device under test (DUT), the method comprising:
- providing an analog output signal to the DUT to obtain an analog device signal in the DUT;
- generating a first digital device signal representative of a DUT current developed in the DUT in response to the analog device signal;
- generating a second digital device signal representative of a DUT voltage developed across a pair of nodes of the DUT in response to the analog device signal;
- generating a digital control signal for regulating the DUT current and/or the DUT voltage, wherein said regulating the DUT current comprises:
  - adjusting the digital control signal until the analog device signal reaches a first value corresponding to a desired DUT current; and
  - adjusting the digital control signal to maintain the analog device signal at the first value until the second digital device signal indicates that the DUT voltage has exceeded a specified first limit;
- wherein said regulating the DUT voltage comprises:
  - adjusting the digital control signal until the analog device signal reaches a second value corresponding to a desired DUT voltage; and
  - adjusting the digital control signal to maintain the analog device signal at the second value, until the first digital device signal indicates that the DUT current has exceeded a specified second limit;
- converting the digital control signal to an analog control signal; and
- generating the analog output signal based on the analog control signal.

35. The method of claim 34;
- wherein said regulating the DUT current further comprises adjusting the digital control signal to lower the analog device signal from the first value until the second digital device indicates that that the DUT voltage is within the specified first limit; and
- wherein said regulating the DUT voltage further comprises adjusting the digital control signal to lower the analog device signal from the second value until the first digital device signal indicates that the DUT current is within the specified second limit.

36. The method of claim 34, wherein said adjusting the digital control signal until the analog device signal reaches the first value comprises:
- comparing a value of the first digital device signal to a setpoint;
- increasing a value of the digital control signal when the value of the first digital device signal is lower than the setpoint; and
- decreasing the value of the digital control signal when the value of the first digital device signal is higher than the setpoint.

37. The method of claim 34, wherein said adjusting the digital control signal until the analog device signal reaches the second value comprises:
- comparing a value of the second digital device signal to a setpoint;
- increasing a value of the digital control signal when the value of the second digital device signal is lower than the setpoint; and
- decreasing the value of the digital control signal when the value of the second digital device signal is higher than the setpoint.

38. The method of claim 36, further comprising programming the setpoint into a digital control loop configured to perform said generating the digital control signal, said regulating the DUT current, and said regulating the DUT voltage.

39. The method of claim 34, further comprising programming the specified first limit and the specified second limit into a digital control loop configured to perform said generating the digital control signal, said regulating the DUT current, and said regulating the DUT voltage.

* * * * *

UNITED STATES PATENT AND TRADEMARK OFFICE
CERTIFICATE OF CORRECTION

| | | |
|---|---|---|
| PATENT NO. | : 7,903,008 B2 | Page 1 of 1 |
| APPLICATION NO. | : 12/266089 | |
| DATED | : March 8, 2011 | |
| INVENTOR(S) | : Regier | |

It is certified that error appears in the above-identified patent and that said Letters Patent is hereby corrected as shown below:

Title page:

Add item (74) *Attorney, Agent, or Firm*:

-- ; Jeffrey C. Hood --.

Signed and Sealed this
Tenth Day of May, 2011

David J. Kappos
*Director of the United States Patent and Trademark Office*